(12) United States Patent
Osajima

(10) Patent No.: US 8,519,551 B2
(45) Date of Patent: Aug. 27, 2013

(54) SEMICONDUCTOR DEVICE WITH I/O CELL AND EXTERNAL CONNECTION TERMINAL AND METHOD OF MANUFACTURING THE SAME

(75) Inventor: Toru Osajima, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/818,588

(22) Filed: Jun. 18, 2010

(65) Prior Publication Data

US 2010/0252830 A1 Oct. 7, 2010

Related U.S. Application Data

(63) Continuation of application No. PCT/JP2007/075249, filed on Dec. 28, 2007.

(51) Int. Cl.
*H01L 23/544* (2006.01)

(52) U.S. Cl.
USPC ............... 257/786; 257/E31.111; 438/612

(58) Field of Classification Search
USPC ............ 257/786, E31.111; 438/612
See application file for complete search history.

(56) References Cited

U.S. PATENT DOCUMENTS

| | | | |
|---|---|---|---|
| 6,150,727 A | 11/2000 | Takagi | |
| 6,242,814 B1* | 6/2001 | Bassett | 257/786 |
| 6,469,396 B1 | 10/2002 | Kawai | |
| 6,548,910 B2 | 4/2003 | Kawai | |
| 6,798,075 B2 | 9/2004 | Liaw et al. | |
| 6,856,022 B2 | 2/2005 | Nojiri et al. | |
| 6,858,945 B2* | 2/2005 | Rakshani | 257/786 |
| 6,953,997 B1* | 10/2005 | Merigot et al. | 257/773 |
| 7,829,983 B2* | 11/2010 | Yamada et al. | 257/666 |
| 2001/0050423 A1 | 12/2001 | Kariyazaki | |
| 2002/0153538 A1 | 10/2002 | Kawai | |
| 2006/0022691 A1* | 2/2006 | Watanabe et al. | 324/754 |
| 2006/0214189 A1* | 9/2006 | Chen | 257/203 |
| 2007/0111376 A1* | 5/2007 | Pendse | 438/106 |
| 2009/0146273 A1 | 6/2009 | Yamada et al. | |
| 2011/0012245 A1 | 1/2011 | Yamada et al. | |

FOREIGN PATENT DOCUMENTS

| | | |
|---|---|---|
| JP | 9-246314 A | 9/1997 |
| JP | 11-307601 A | 11/1999 |
| JP | 11307601 A * | 11/1999 |

(Continued)

OTHER PUBLICATIONS

International Search Report of PCT/JP2007/75249, mailing date of Feb. 5, 2008.

(Continued)

*Primary Examiner* — N Drew Richards
*Assistant Examiner* — John P Dulka
(74) *Attorney, Agent, or Firm* — Fujitsu Patent Center

(57) ABSTRACT

A first external connection terminal at a first row is disposed to position at upside of a first I/O cell, and a second external connection terminal at a second row is formed at upside of a boundary portion between two adjacent first I/O cells. Here, the first external connection terminal and the second external connection terminal are disposed to be separated for a predetermined distance so as not to have an overlapped portion with each other, and formed in an identical layer. According to the constitution, it is possible to prevent disadvantages such as characteristic deterioration of a semiconductor integrated circuit and accuracy deterioration of an electrical inspection.

20 Claims, 17 Drawing Sheets

(56) References Cited

FOREIGN PATENT DOCUMENTS

| | | | |
|---|---|---|---|
| JP | 2001-351983 A | 12/2001 |
| JP | 2002-299567 A | 10/2002 |
| JP | 2006-39335 A | 12/2006 |
| JP | 2006-339335 A | 12/2006 |
| JP | 2007-305822 A | 11/2007 |
| WO | 00/31799 A1 | 6/2000 |
| WO | 2004/093191 A1 | 10/2004 |
| WO | 2007-015435 A1 | 2/2007 |
| WO | WO 2007015435 A1 * | 2/2007 |
| WO | WO-2007-136932 A2 | 11/2007 |

OTHER PUBLICATIONS

Korean Office Action dated Aug. 10, 2011, issued in corresponding Korean Patent Application No. 10-2010-7013227.

Notification of Transmittal of Translation of the International Preliminary Report Patentability (Form PCT/IB/338) of International Application No. PCT/JP2007/075249 mailed Aug. 19, 2010 with Forms PCT/IB/373 and PCT/ISA/237.

Extended European Search Report dated May 7, 2013 for corresponding European Application No. 07860452.7.

* cited by examiner

SEMICONDUCTOR DEVICE WITH I/O CELL AND EXTERNAL CONNECTION TERMINAL AND METHOD OF MANUFACTURING THE SAME

CROSS-REFERENCE TO RELATED APPLICATIONS

This application is a Continuation of International Application No. PCT/JP2007/075249, with an international filing date of Dec. 28, 2007, designating the United States of America, the entire contents of which are incorporated herein by reference.

FIELD

The present invention relates to a semiconductor device constituted by providing I/O cells and external connection terminals arranged in parallel at a surface thereof and a manufacturing method thereof, and in particular, a semiconductor device in which the above-stated arrays are arranged in plural at the surface.

BACKGROUND

Conventionally, plural bonding pads to electrically connect internal circuits thereof to external are disposed along an outer periphery of a surface in a semiconductor chip.

External terminals such as a lead frame are connected to these bonding pads by, for example, bonding wires made of gold by a predetermined assembly process.

Besides, the bonding pad also functions as an abutting portion to bring probe needles of a tester into contact when an electrical inspection such as a characteristic test of the semiconductor chip is performed in addition to function as the pad to connect the bonding wire. In this case, a scratch called as a probe trace remains at a surface of the bonding pad when the probe needles of the tester are brought into contact with the bonding pad to perform the electrical inspection.

In recent years, requirements for higher integration and higher function arise for the semiconductor device, and miniaturization of the semiconductor chip is required and more electrodes are provided on the semiconductor chip. It is necessary to provide more bonding pads within a limited region at the surface of the semiconductor chip to correspond to the above requirements.

However, in this case, there is a problem in which the electrical connection of the probe needles with the bonding pad becomes insufficient when the region of the bonding pad is reduced because the probe trace at the surface of the bonding pad protrudes out of the bonding pad.

For example, a method in which the bonding pads are disposed at an input/output circuit region of a circuit region to secure region for the bonding pads is employed in Patent Document 1 corresponding to the aforementioned problem. Further, there also is a method in which a part of the bonding pads is formed to protrude out of the input/output circuit region, to further secure the region of the bonding pads for in Patent Document 2.

Recently, requirements for high integration, high function of a semiconductor device arise more and more, and for example, it is proposed that bonding pads are formed by arranging in parallel in two rows as in Patent Document 3. Incidentally, a case when the bonding pads are formed in one row is exemplified in FIG. 3, and a case when the bonding pads in one row are rearranged alternately is exemplified in FIG. 5 and FIG. 6 in the Patent Document 1.

The Patent Document 1 in which the above-stated various constitutions are disclosed is applied to the Patent Document 2 (,3), and thereby, a constitution is conceivable in which I/O cells where the bonding pads are disposed are arranged in two rows at the input/output circuit region. However, in this case, lengths of the bonding wires to be connected become significantly uneven, by each row and characteristic deterioration of an integrated circuit of the semiconductor chip occurs resulting from the distance difference of the bonding wires. Besides, in this case, there is a problem in which disposed states of probe needles of a tester become uneven by each row, and characteristic difference (difference of L, R, C, L indicates inductance, R indicates resistance, C indicates capacitance) occurs in the probe needles resulting from the unevenness, and an accurate inspection result cannot be obtained.

Patent Document 1: Japanese Laid-open Patent Publication No. 11-307601
Patent Document 2: International Publication Pamphlet No. WO2004/93191
Patent Document 3: Japanese Laid-open Patent Publication No. 9-246314

SUMMARY

A semiconductor device according to the present invention includes: a semiconductor substrate; a first row in which a plurality of first I/O cells and a plurality of first external connection terminals are disposed in parallel at an outer periphery of a surface; and a second row in which a plurality of second I/O cells and a plurality of second external connection terminals are disposed in parallel at inside of the first row, at upside of the semiconductor substrate. Here, each of the second external connection terminals is disposed such that a part thereof positions at upside of the first I/O cell.

A manufacturing method of a semiconductor device according to the present invention includes: forming a first row constituted by a plurality of disposing first I/O cells and a plurality of first external connection terminals in parallel at an outer periphery of a surface, and a second row constituted by a plurality of disposing second I/O cells and a plurality of second external connection terminals in parallel at inside of the first row, at upside of a semiconductor substrate. Here, each of the second external connection terminals is disposed such that a part thereof positions at upside of the first I/O cell at the first row.

According to the present invention, it is possible to provide a semiconductor device with high reliability capable of preventing disadvantages such as characteristic deterioration of a semiconductor integrated circuit and accuracy deterioration of an electrical inspection while fully securing an electrical connection of probe needles with external connection terminals at the electrical inspection time, and enabling higher integration, higher function of the semiconductor device by shortening a distance between adjacent external connection terminals at a first row and a second row as much as possible, in the semiconductor device having a constitution in which I/O cells disposing the external connection terminals are arranged in parallel in two rows.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWING(S)

DESCRIPTION OF EMBODIMENT(S)

Hereinafter, concrete embodiments to which the present invention is applied are described in detail with reference to the drawings.

First Embodiment

—Configuration of Semiconductor Device—

Figure 1:
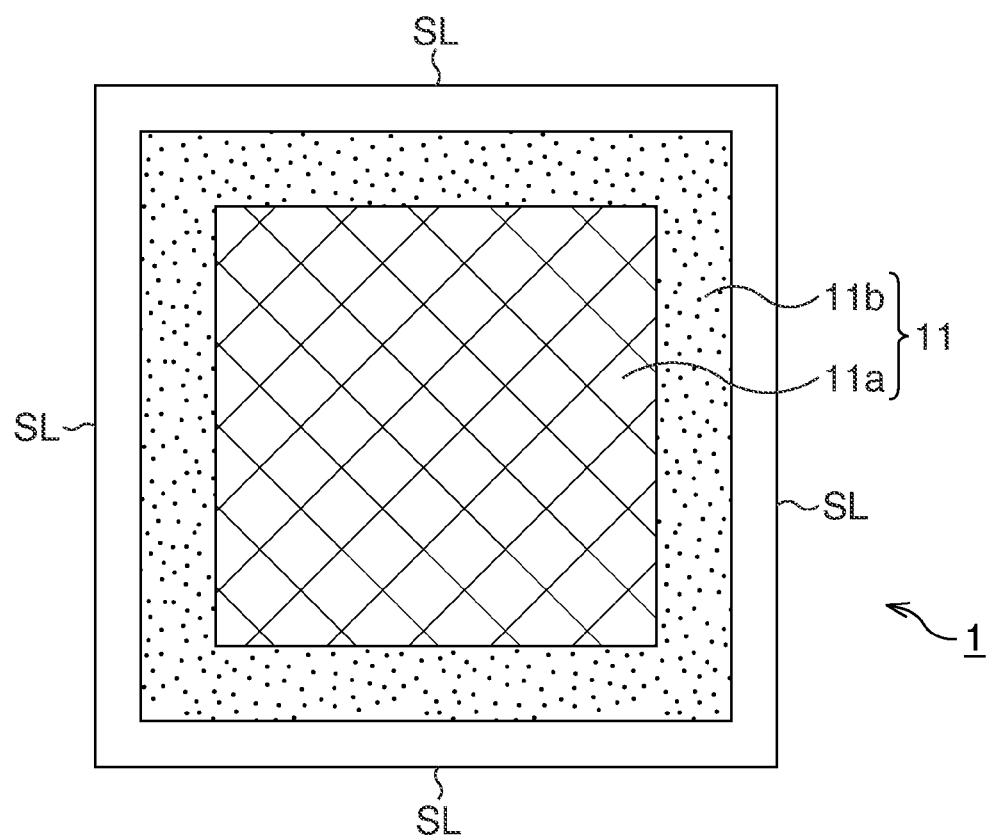
FIG. 1 is a plan view illustrating an appearance of a semiconductor chip being a component of a semiconductor device according to the present embodiment.
Figure 2:
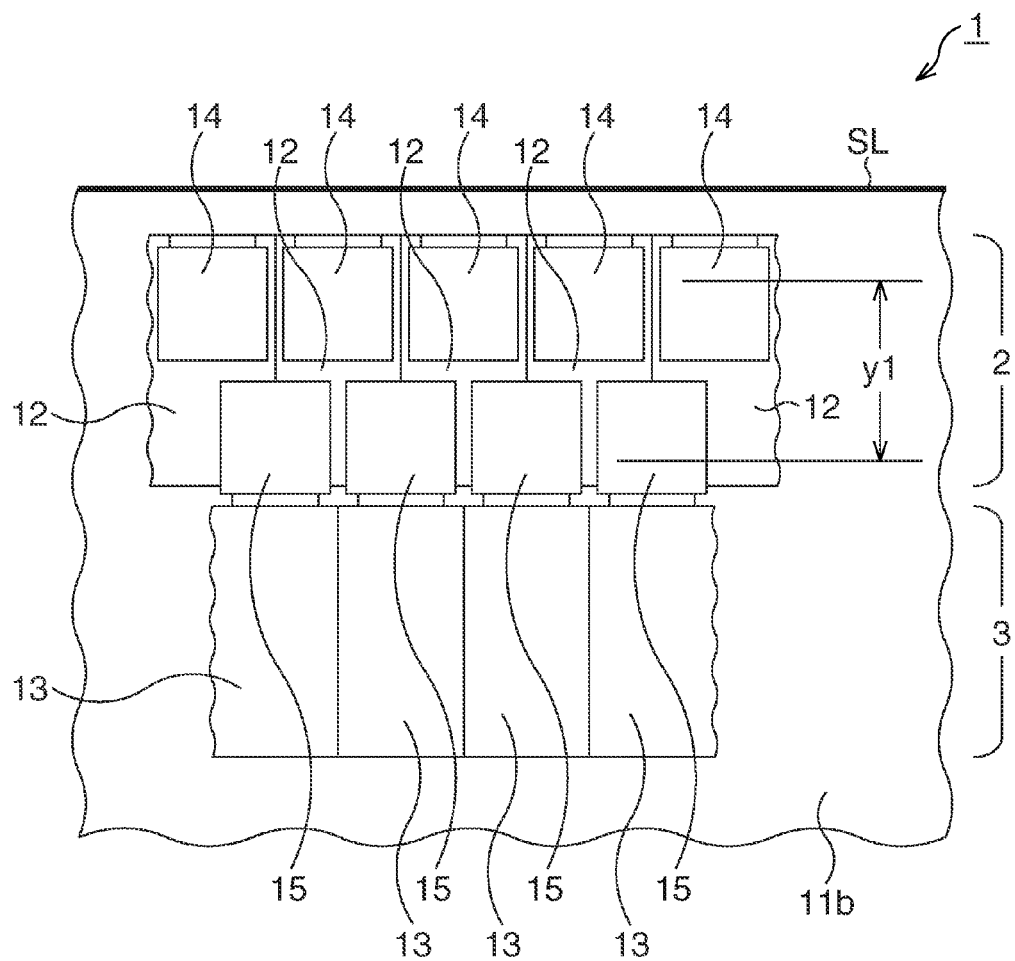
FIG. 2 is a plan view illustrating a schematic configuration in which a part of a surface of the semiconductor chip being the component of the semiconductor device according to the present embodiment is enlarged to be illustrated.

FIG. 1 is a plan view illustrating an appearance of a semiconductor chip being a component of a semiconductor device according to the present embodiment. FIG. 2 is a plan view illustrating a schematic configuration in which a part of a surface of the semiconductor chip being the component of the semiconductor device according to the present embodiment is enlarged to be illustrated. Incidentally, in FIG. 1, only an outside contour of an input/output circuit region is illustrated as a matter of convenience of illustration.

As illustrated in FIG. 1, a semiconductor chip 1 being a component of the semiconductor device according to the present embodiment is constituted by being formed in plural on a semiconductor substrate in matrix state, and cut out along a scribe line SL from the semiconductor substrate. Accordingly, a rim of the semiconductor chip 1 corresponds to the scribe line SL.

On the semiconductor chip 1, a circuit forming region 11 including a semiconductor integrated circuit and so on having predetermined functions such as various transistors (MOS transistor, bipolar transistor, and so on) and various semiconductor memories (MNOS transistor, flash memory, memory capacitor and so on such as DRAM) is formed at upside of a silicon substrate (not-illustrated) so as to almost occupy a surface region of the semiconductor chip 1. The circuit forming region 11 has an internal circuit forming region 11a constituted by semiconductor elements as stated above to perform substantial processes and an input/output circuit region 11b being a forming region of I/O cells.

Plural I/O cells constituted by including a semiconductor integrated circuit such as a TTL (Transistor-Transistor Logic) circuit are provided at the input/output circuit region 11b. In the present embodiment, a first row 2 in which plural first I/O cells 12 are arranged in parallel at an outer periphery of the input/output circuit region 11b (at a position near the scribe line SL) and a second row 3 in which plural second I/O cells 13 are arranged in parallel at inside of the first row 2 (at a position near the internal circuit forming region 11a) are disposed at the input/output circuit region 11b as illustrated in FIG. 2.

A first external connection terminal 14 is provided at each of the first I/O cells 12, and a second external connection terminal 15 is provided at each of the second I/O cells 13, respectively. The first external connection terminal 14 and the second external connection terminal 15 function as pads for external connection, here, bonding pads (bonding portions) to connect bonding wires, and also function as abutting pads (inspection target portions) with which probe needles of a tester are brought into contact when an electrical inspection such as characteristic test of the semiconductor chip is performed.

In the present embodiment, the first external connection terminal 14 is disposed so that at least a part thereof (all in the illustrated example) positions at upside of the first I/O cell 12, and the second external connection terminal 15 is disposed so that at least a part thereof (a portion except a lower end portion in the illustrated example) positions at upside of the first I/O cell 12, as illustrated in FIG. 2. Specifically, the second external connection terminal 15 is formed at upside of a boundary portion of two adjacent first I/O cells 12. Here, the first external connection terminal 14 and the second external connection terminal 15 are formed in an identical layer while being separated from one another for a predetermined distance so as not to have an overlapped portion.

In the present embodiment, the first external connection terminal 14 and the second external connection terminal 15 are disposed in proximity as much as possible at the first row 2 and the second row 3, and a separation distance between both, here, the separation distance from a planned connection portion of the bonding wire of the first external connection terminal 14 to a planned connection portion of the bonding wire of the second external connection terminal 15 becomes "y1" as illustrated in the drawing.

Here, a comparative example of the semiconductor chip 1 of the present embodiment is represented. Comparative Example 1

Figure 3:
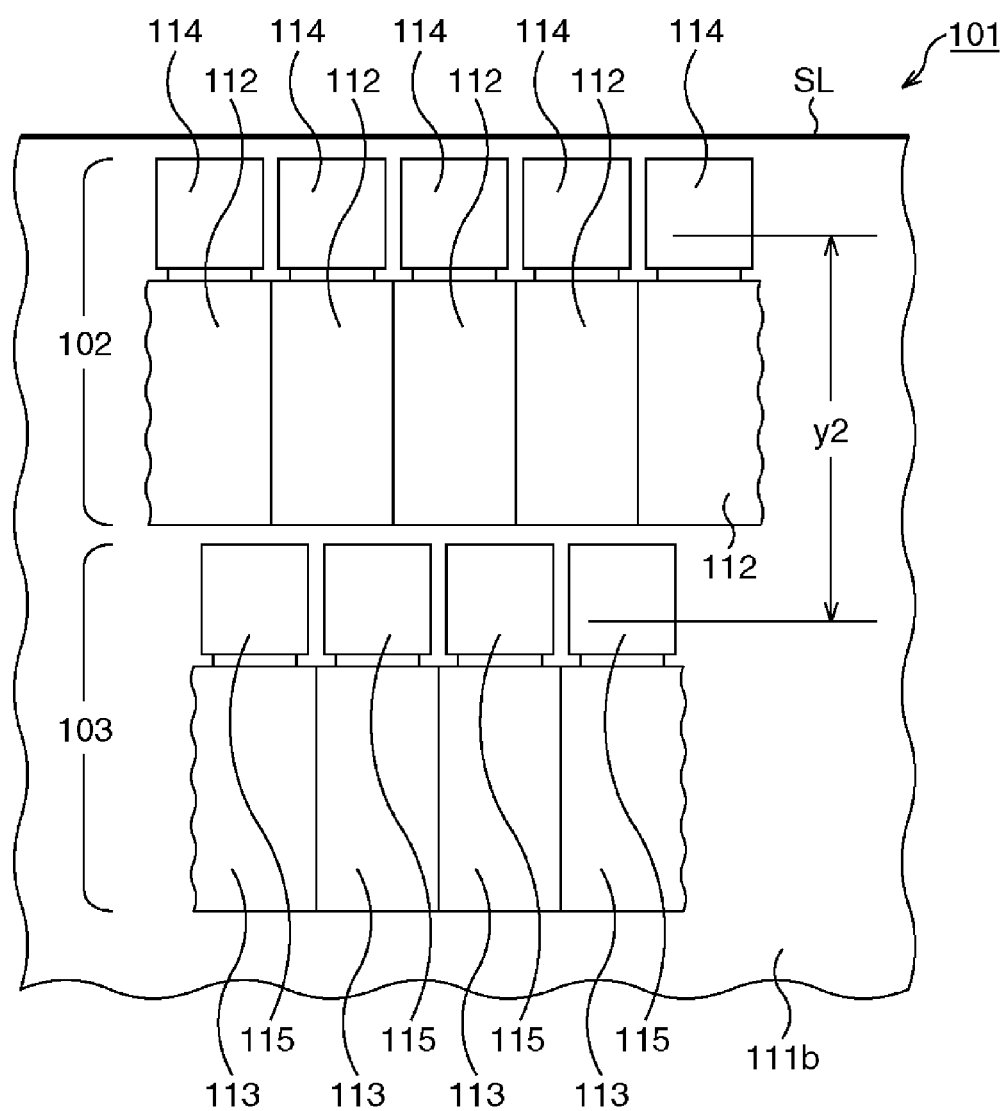
FIG. 3 is a plan view illustrating a schematic configuration in which a part of a surface of a semiconductor chip of a comparative example 1 is enlarged to be illustrated.

FIG. 3 is a plan view illustrating a schematic configuration in which a part of a surface of a semiconductor chip of a comparative example 1 is enlarged to be illustrated.

In a semiconductor chip 101 of the present example, a first row 102 in which plural first I/O cells 112 are arranged in parallel at an outer periphery of an input/output circuit region 111b (at a position near a scribe line SL) and a second row 103 in which plural second I/O cells 113 are arranged in parallel at inside of the first row 102 (at position near the internal circuit forming region.) are disposed at the input/output circuit region 111b.

A first external connection terminal 114 is provided at each of the first I/O cells 112, and a second external connection terminal 115 is provided at each of the second I/O cells 113, respectively.

In the present example, the first external connection terminal 114 connected by one end of the first I/O cell 112 and positioning at outside of the first I/O cell 112 (scribe line SL side) is disposed at the first row 102, and the second external connection terminal 115 connected by one end of the second I/O cell 113 and positioning at outside of the second I/O cell 113 (scribe line SL side) is disposed at the second row 103, respectively.

A separation distance between the first external connection terminal 114 and the second external connection terminal 115, here, the separation distance from a planned connection portion of a bonding wire of the first external connection terminal 114 to a planned connection portion of a bonding wire of the second external connection terminal 115 becomes "y2" as illustrated in the drawing.

Comparative Example 2

Figure 4:
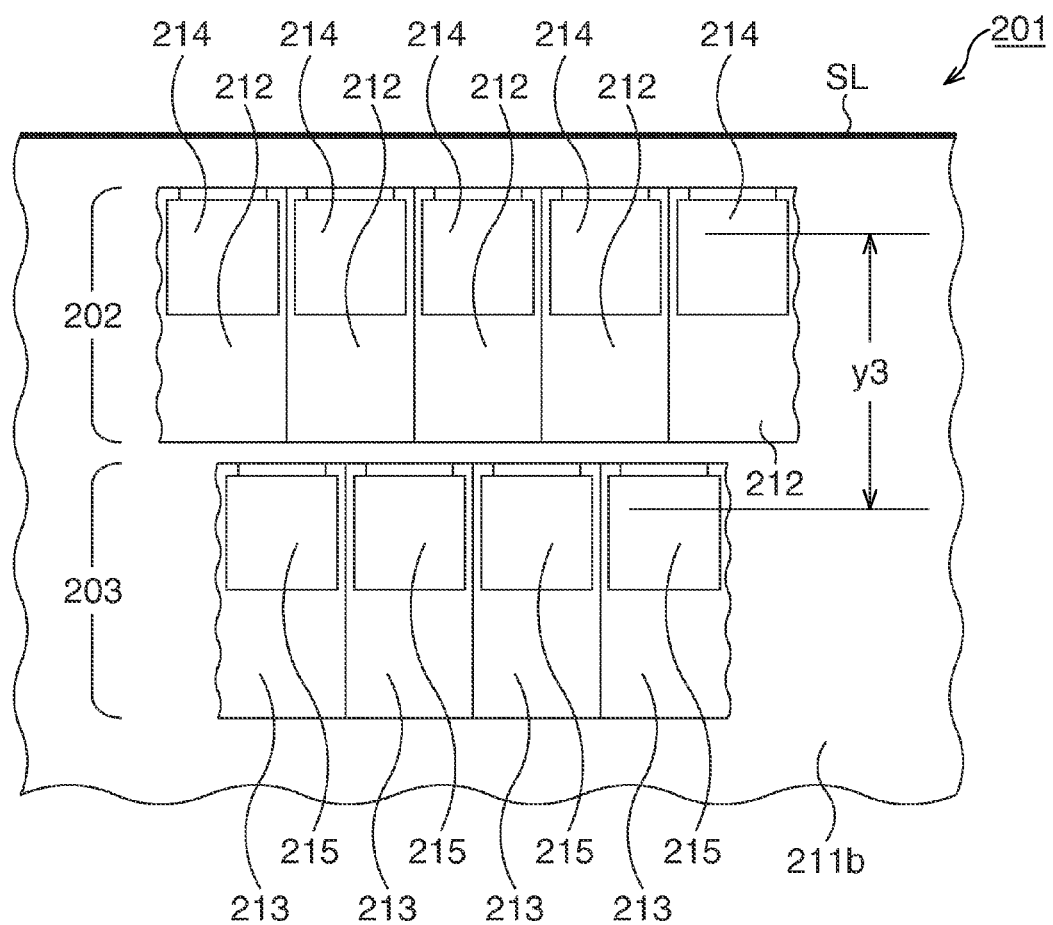
FIG. 4 is a plan view illustrating a schematic configuration in which a part of a surface of a semiconductor chip of a comparative example 2 is enlarged to be illustrated.

FIG. 4 is a plan view illustrating a schematic configuration in which a part of a surface of a semiconductor chip of a comparative example 2 is enlarged to be illustrated In a semiconductor chip 201 of the present example, a first row 202 in which plural first I/O cells 212 are arranged in parallel at an outer periphery of an input/output circuit region 211b (at a position near the scribe line SL) and a second row 203 in which plural second I/O cells 213 are arranged in parallel at inside of the first row 202 (at position near the internal circuit forming region.) are disposed at the input/output circuit region 211b.

A first external connection terminal 214 is provided at each of the first I/O cells 212, and a second external connection terminal 215 is provided at each of the second I/O cells 213, respectively.

In the present example, the first external connection terminal 214 connected by one end of the first I/O cell 212 and positioning at upside of the first I/O cell 212 is disposed at the first row 202, and the second external connection terminal 215 connected by one end of the second I/O cell 213 and positioning at upside of the second I/O cell 213 is disposed at the second row 203, respectively.

A separation distance between the first external connection terminal 214 and the second external connection terminal 215, here, the separation distance from a planned connection portion of a bonding wire of the first external connection terminal 214 to a planned connection portion of a bonding wire of the second external connection terminal 215 becomes "y3" as illustrated in the drawing.

The separation distance is shortened in the semiconductor chip 201 of the comparative example 2 than in the semiconductor chip 101 of the comparative example 1 because "y3<y2" as in the comparative examples 1, 2. However, it is impossible to shorten the separation distance than "y3" as long as a disposed state of the I/O cells and the external connection terminals in the constitution of the first row and a disposed state of the I/O cells and the external connection terminals in the constitution of the second row are formed similarly.

The separation distance "y1" in the semiconductor chip 1 of the present embodiment becomes "y1<y3<y2". In the semiconductor chip 1 of the present embodiment, it is possible to drastically shorten the separation distance compared to the comparative examples 1, 2.

—Manufacturing Method of Semiconductor Device—

Hereinafter, a manufacturing method of the semiconductor device having the above-stated constitution is described.

Figure 5A:
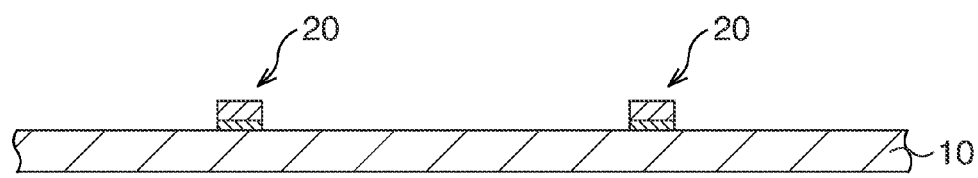
FIG. 5A is a schematic diagram illustrating a manufacturing method of the semiconductor device according to the present embodiment in process sequence.
Figure 5B:
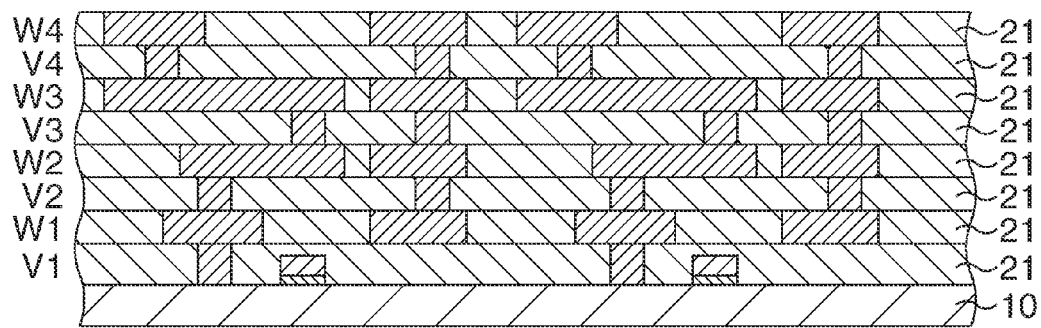
FIG. 5B is a schematic diagram illustrating the manufacturing method of the semiconductor device according to the present embodiment in process sequence.
Figure 5C:
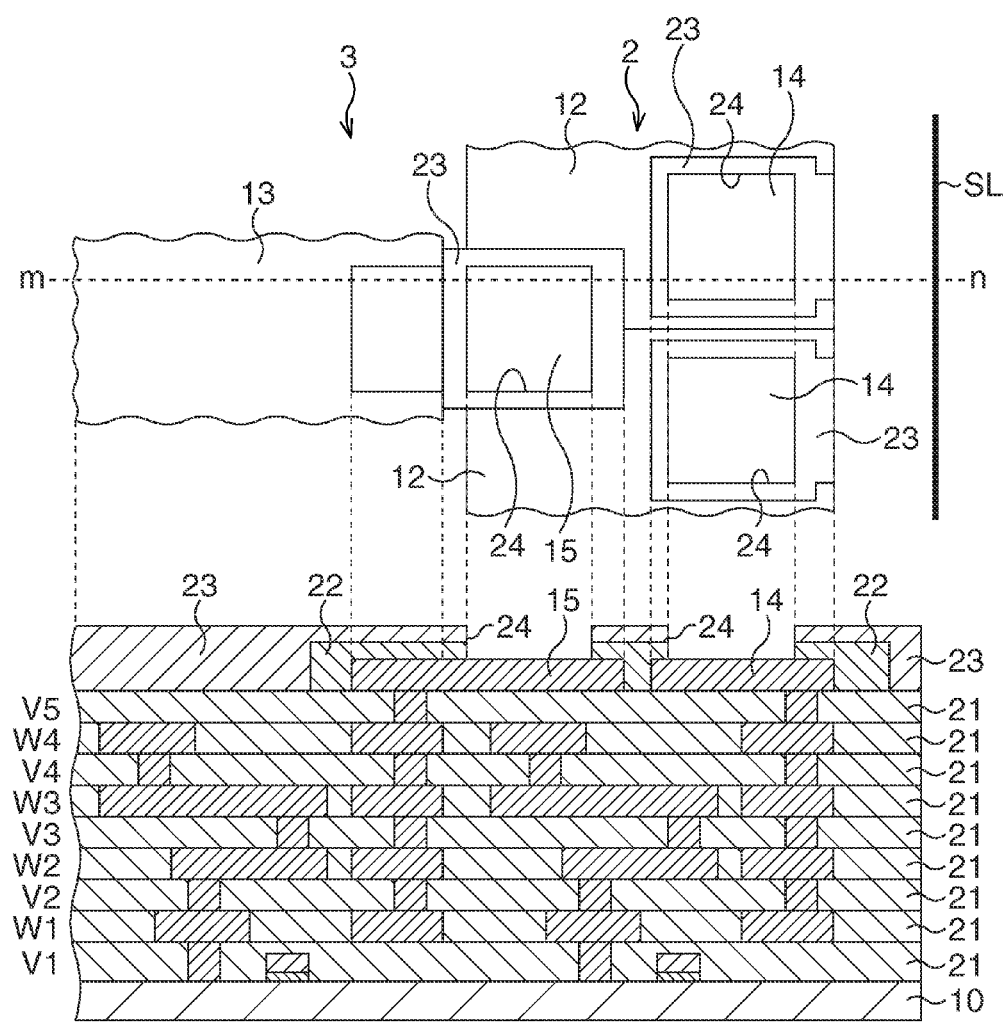
FIG. 5C is a schematic diagram illustrating the manufacturing method of the semiconductor device according to the present embodiment in process sequence.
Figure 5D:
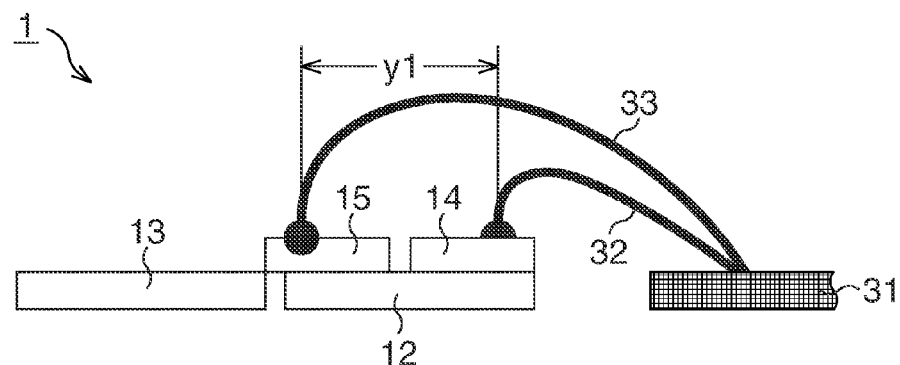
FIG. 5D is a schematic diagram illustrating the manufacturing method of the semiconductor device according to the present embodiment in process sequence.
Figure 5E:
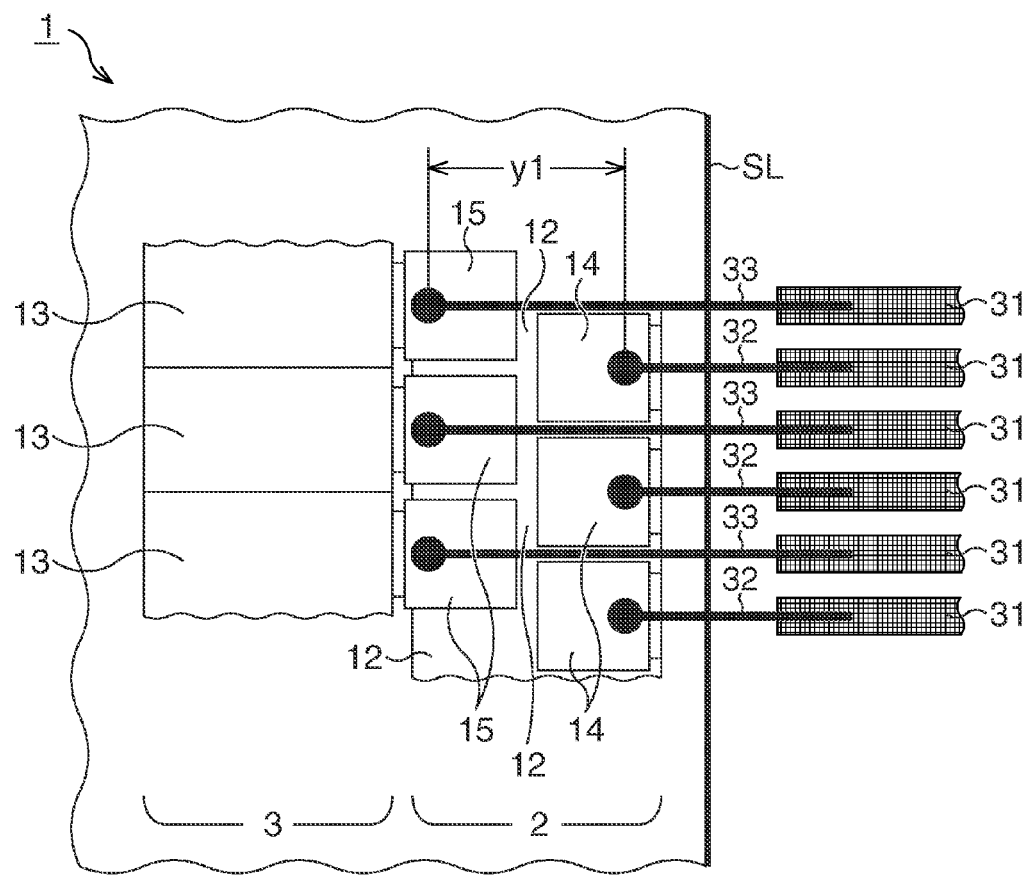
FIG. 5E is a schematic diagram illustrating the manufacturing method of the semiconductor device according to the present embodiment in process sequence.

FIG. 5A to FIG. 5E are schematic diagrams illustrating the manufacturing method of the semiconductor device according to the present embodiment in process sequence. Here, lower parts of the drawings of FIG. 5A, FIG. 5B and FIG. 5C correspond to a cross section along a dotted line m-n in an upper part of the drawing in FIG. 5C. Besides, in the lower part of the drawing of FIG. 5C, respective interlayer insulating films embedding respective layers are represented as "interlayer insulating films 21" as a whole. Besides, FIG. 5D is a side view, and FIG. 5E is a plan view.

At first, various kinds of semiconductor integrated circuits and so on constituting the circuit forming region 11 are formed on a semiconductor substrate 10. Specifically, the semiconductor integrated circuit constituted by predetermined transistors, semiconductor memories, and so on is formed at the internal circuit forming region 11a, and the TTL circuit and so on are formed at the input/output circuit region 11b, respectively.

Here, only the input/output circuit region 11b is illustrated, and MOS transistors 20 (only gate portions thereof are illustrated) being one of components of the TTL circuit are exemplified as illustrated in FIG. 5A.

Subsequently, various kinds of wiring structures constituting the circuit forming region 11 are formed. The wiring structure is constituted by wirings and via portions connecting the wirings and so on at upward and downward. Specifically, plural layers of wirings connected to the semiconductor integrated circuit constituted by the predetermined transistors, semiconductor memories and so on are formed at the internal circuit forming region 11a, and plural layers of wirings connected to the TTL circuit and so on are formed at the input/output circuit region 11b, respectively. Here, the wirings and the via portions at each layer of the circuit forming region 11a side and the wirings and the via portions at each layer of the input/output circuit region 11b side are formed by the same process by each layer.

Here, only the input/output circuit region 11b is illustrated, and a multilayer wiring structure appropriately connected to the MOS transistor 20 being one of the components of the TTL circuit, here, wirings W1 to W4 in four layers and via portions V1 to V4 in four layers are exemplified as illustrated in FIG. 5B.

At first, the via portion V1 connected to the semiconductor integrated circuit constituted by the predetermined transistors, the semiconductor memories and so on (connected to source/drain regions, gate electrode in case of the MOS transistor) is formed at the internal circuit forming region 11a.

In detail, contact holes (not-illustrated) exposing a part of surfaces of the source/drain regions and so on are formed at the interlayer insulating film 21, then Ti and TiN are deposited so as to cover an internal surface of the contact hole to form a glue film (not-illustrated). A conductive substance, here, tungsten (W) is deposited so as to embed the contact hole via the glue film by a CVD method and so on. After that, a surface of W is smoothed by, for example, a CMP, and the via portion V3 constituted by filling the contact hole with W is formed.

Next, the wiring W1 to the wiring W3 and the via portions V2, V3 are appropriately formed as Cu layers as stated below by so-called a single damascene method or a dual damascene method while using, for example, Cu or an alloy thereof as a material.

In the single damascene method, wiring grooves, openings, and so on are formed at the interlayer insulating film 21, Cu or the alloy thereof is embedded by a plating method so as to embed the wiring grooves, the openings, and so on. A surface thereof is smoothed by, for example, a chemical mechanical polishing (CMP), and the Cu layer filling the wiring grooves, the openings, and so on with Cu or the alloy thereof is formed.

In the dual damascene method, the wiring grooves, the openings, and so on and via holes to be integrated thereto are simultaneously formed at the interlayer insulating film 21, Cu or the alloy thereof is embedded by the plating method so as to embed the wiring grooves, the openings and so on, and the via holes. The surface thereof is smoothed by, for example, the CMP, and the Cu layer constituted by filling the wiring grooves, the openings and so on, and the via holes with Cu or the alloy thereof is formed.

Next, the via portion V4 connected to the wiring W3 is formed.

In detail, via holes (not-illustrated) exposing a part of a surface of the wiring W3 are formed at the interlayer insulating film 21, then Ti and TiN are deposited so as to cover an internal surface of the via hole to form a glue film (not-illustrated). A conductive substance, here, tungsten (W) is deposited so as to embed the via hole via the glue film by the CVD method and so on. After that, a surface of W is smoothed by, for example, the CMP, and the via portion V4 constituted by filling the via hole with W is formed.

Next, the wiring W4 connected to the via portion V4 is formed.

In detail, aluminum or an alloy thereof is deposited on the interlayer insulating film 21 where an upper surface of the via portion V4 exposes by a sputtering method and so on, to form an Al film (not-illustrated). This Al film is processed by lithography and dry etching. The wiring W4 constituted by connected to the via portion V4 on the interlayer insulating film 21 is thereby formed.

Here, a part of the wirings W1 to W4 and V2 to V4 constitutes a base structure of the first external connection terminal 14 and the second external connection terminal 15.

Subsequently, the via portion V5, the first external connection terminal 14, the second external connection terminal 15, a protective film 22, and a PI film 23 are formed as illustrated in FIG. 5C.

At first, the via portion V5 connected to the wiring W4 being a component of the base structure of the first external connection terminal 14 and the second external connection terminal 15 is formed from among the wiring W4.

In detail, via holes (not-illustrated) exposing a part of a surface of the wiring W4 are formed at the interlayer insulating film 21, then Ti and TiN are deposited so as to cover an internal surface of the via hole to form a glue film (not-illustrated). A conductive substance, here, tungsten (W) is deposited so as to embed the via hole via the glue film by the CVD method and so on. After that, a surface of W is smoothed by, for example, the CMP, and the via portion V5 constituted by filling the via hole with W is formed.

Next, the first external connection terminal 14 and the second external connection terminal 15 connected to the via portion V5 are formed.

In detail, aluminum or the alloy thereof is deposited on the interlayer insulating film 21 where an upper surface of the via portion V5 exposes by the sputtering method and so on, to form an Al film (not-illustrated). This Al film is processed by lithography and dry etching. The process is performed to make forms of the above-stated first row 2 and second row 3. Accordingly, the first external connection terminal 14 and the second external connection terminal 15 respectively connected to the via portions 5 on the interlayer insulating film 21 are formed.

Next, an insulating film, here, a silicon oxide film is deposited on a whole surface so as to cover the first external connection terminal 14 and the second external connection terminal 15 by the CVD method and so on. The silicon oxide film is processed into a predetermined form covering from surfaces to side surfaces of the first external connection terminal 14 and the second external connection terminal 15 by lithography and dry etching, to form a protective film 22.

Next, a cover film, here, a PI (polyimide) film 23 is formed on a whole surface, and the PI film 23 and the protective film 22 are processed by lithography and dry etching so as to expose a part of the surfaces of the first external connection terminal 14 and the second external connection terminal 15, to form openings 24.

As stated above, the first row 2 constituted by the first I/O cells 12 respectively defined as occupied regions for the semiconductor integrated circuits such as the TTL circuit at the input/output circuit region 11b and the first external connection terminals 14 connected thereto, and the second row 3 constituted by the second I/O cells 13 respectively defined as occupied regions for the semiconductor integrated circuits such as the TTL circuit at the input/output circuit region 11b and the second external connection terminals 15 connected thereto are completed.

Subsequently, each semiconductor chip 1 is cut out from the semiconductor substrate 10 along the scribe line.

Next, the first external connection terminal 14 and the second external connection terminal 15 of the semiconductor chip 1 are electrically connected to a lead frame (not-illustrated) in an assembly process as illustrated in FIG. 5D and FIG. 5E.

In detail, the first external connection terminal 14 of the semiconductor chip 1 and a bonding finger 31 of the lead frame are connected (wire bonded) by a bonding wire 32 made of gold or the like, and the second external connection terminal 15 and the bonding finger 31 of the lead frame are connected (wire bonded) by a bonding wire 33 made of gold or the like, alternately.

At this time, a difference between a length of the bonding wire 32 in plane view and a length of the bonding wire 33 in plane view (the above-stated separation distance) is shortened as much as possible, to be the separation distance "y1" in the illustrated example.

Figure 6A:
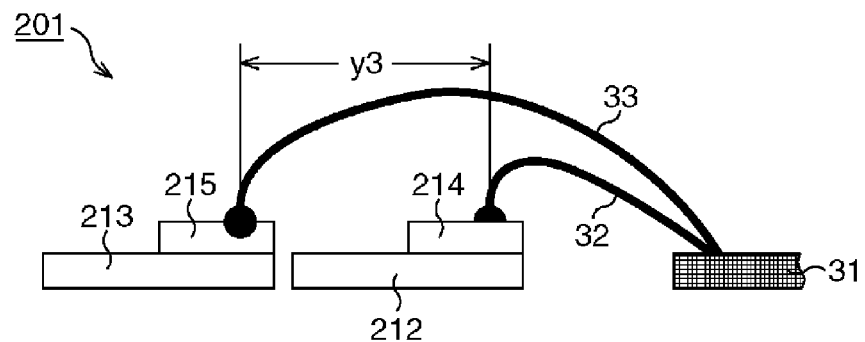
FIG. 6A is a side view illustrating an appearance in which the semiconductor chip of the comparative example 2 is wire bonded.
Figure 6B:
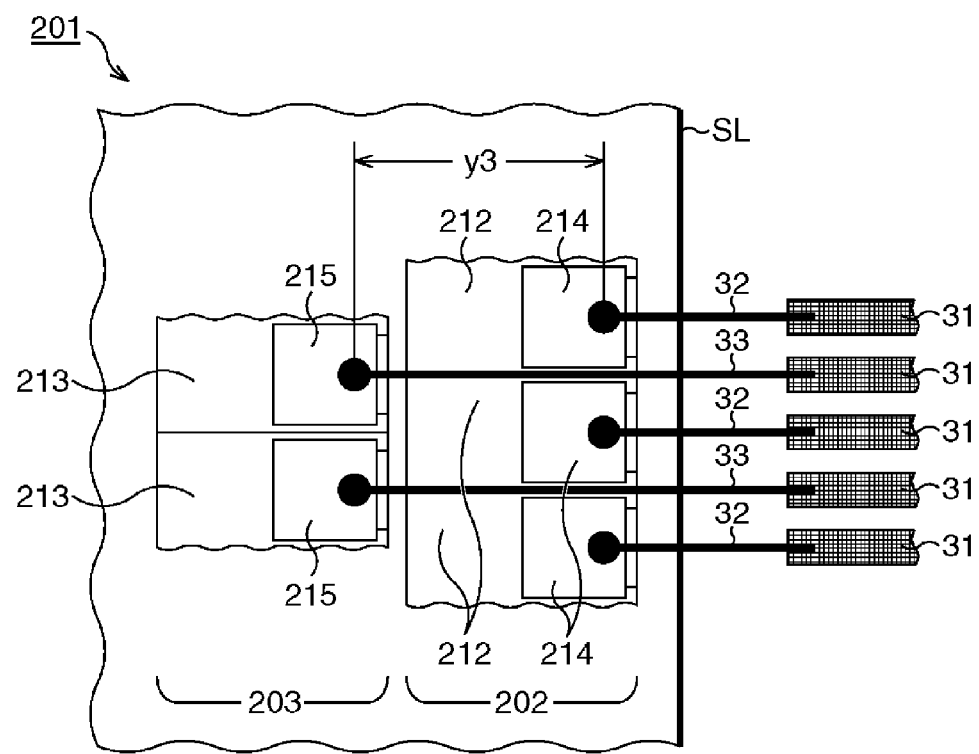
FIG. 6B is a plan view illustrating an appearance in which the semiconductor chip of the comparative example 2 is wire bonded.

As a reference object of the present embodiment, an appearance in which the semiconductor chip 201 of the comparative example 2 is wire bonded is illustrated in FIG. 6A and FIG. 6B (FIG. 6A is a side view, and FIG. 6B is a plane view).

In FIG. 6A and FIG. 6B, a difference between a length of the bonding wire 32 in plane view and a length of the bonding wire 33 in plane view (the above-stated separation distance) becomes "y3". At this time, a relation between the separation distances "y1", "y3" is "y1<y3", and superiority of the present embodiment over the comparative example is represented.

After that, the semiconductor chip 1 is molded and so on with a molding resin, and the semiconductor device of the present embodiment is completed by going through various post-processes.

Incidentally, an electrical inspection of electrical characteristic and so on of the semiconductor device is performed, for example, under a state in FIG. 5C (a state before the semiconductor chip 1 is cut out from the semiconductor substrate 10 and plural semiconductor chips 1 are formed on the semiconductor substrate 10).

Hereinafter, an inspection method of the electrical characteristic of the semiconductor chip 1 is described.

Figure 7:
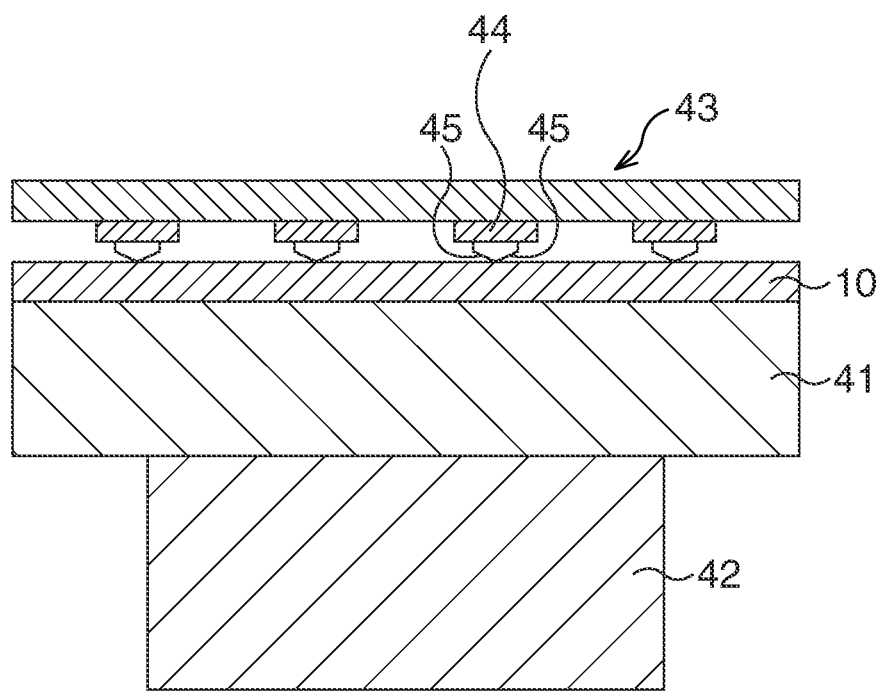
FIG. 7 is a schematic diagram illustrating a schematic configuration of an inspection device (probing device) used in this electrical inspection.

FIG. 7 is a schematic diagram illustrating a schematic configuration of an inspection device (probing device) used for the electrical inspection.

A target of the electrical inspection is the semiconductor substrate 10 on which plural semiconductor chips 1 are formed. A probe card 43 used for this electrical inspection is constituted by providing plural probe holders 44 at a base thereof in rectangular. Plural probe needles 45 brought into contact with the first external connection terminal 14 and the second external connection terminal 15 of the semiconductor chip 1 are provided at the probe holder 44.

This probing device is constituted by providing a wafer stage 41 on which the semiconductor substrate 10 is mounted to be fixed, and an inspection portion 42 provided at, for example, a lower portion of the wafer stage 41 and electrically connected to the probe needles 45 of the probe card 43 to perform the electrical inspection.

A continuity is secured by bringing the probe needles 45 into contact with respective terminal surfaces of the plural first external connection terminals 14 and second external connection terminals 15 by inclining the probe needles 45 from a direction perpendicular to terminal surfaces, and the electrical characteristic is measured by the inspection portion 42, to perform the electrical inspection of the semiconductor chip 10.

As described hereinabove, according to the present embodiment, it is possible provide a semiconductor device with high reliability capable of preventing disadvantages such as characteristic deterioration of semiconductor integrated circuits and accuracy deterioration of electrical inspection while fully securing the electrical connection from the probe needles with the first external connection terminal 14 and the second external connection terminal 15 at the electrical inspection time and enabling the higher integration and higher function of the semiconductor chip 1, by shortening the distance between the first external connection terminal 14 and the second external connection terminal 15 adjacent at the first row 2 and the second row 3 as much as possible, in the semiconductor device having the constitution in which the I/O cells where the external connection terminals are disposed are arranged in parallel in two rows.

Hereinafter, various modification examples of the first embodiment are described. Semiconductor devices in these modification examples are manufactured by the same manufacturing method with the same constitution as the semiconductor device according to the first embodiment, but it is different from the first embodiment in a point that there is a partial additional constitution.

Incidentally, the same reference numerals and symbols are used to designate the same and corresponding composing members and so on as the first embodiment, and the detailed description thereof will not be given in these modification examples.

Modification Example 1

Figure 8:
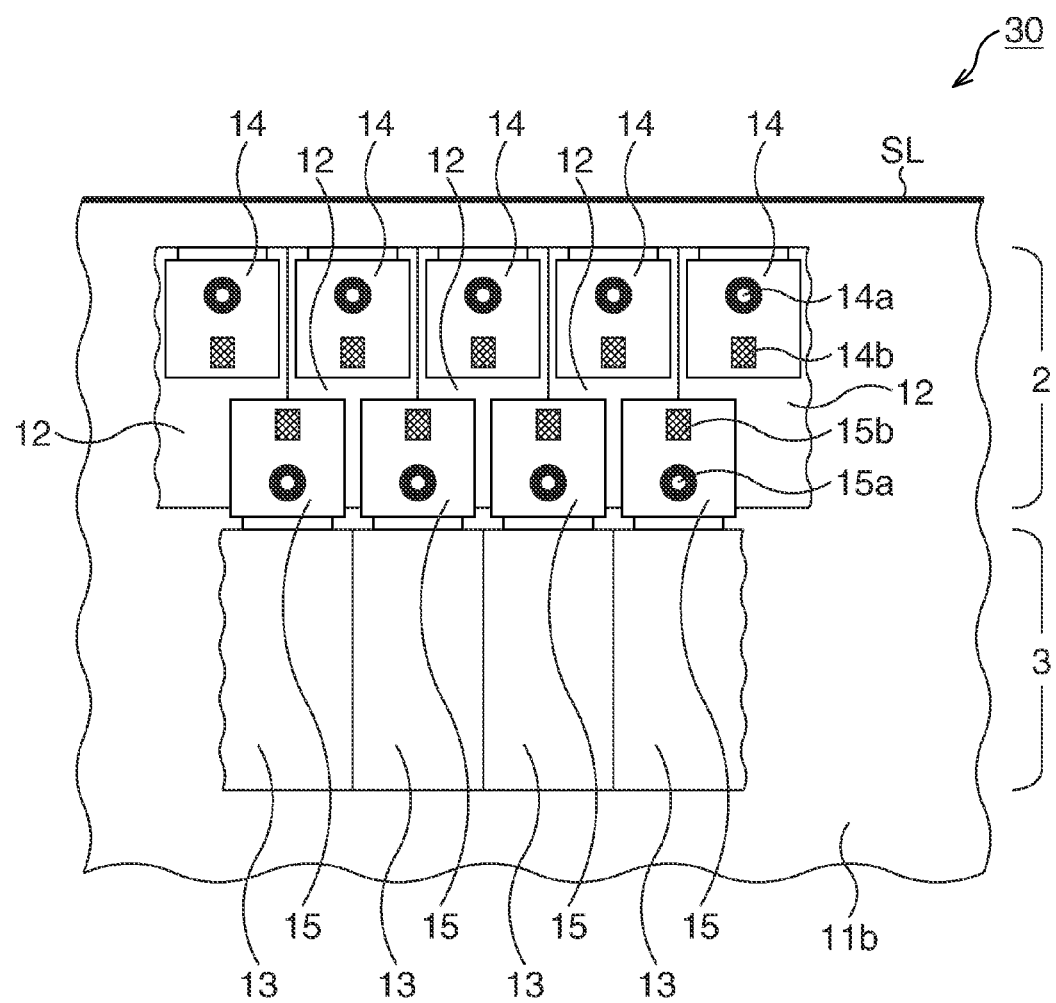
FIG. 8 is a plan view illustrating a schematic configuration in which a part of a surface of a semiconductor chip being a component of a semiconductor device according to a modification example 1 of the first embodiment is enlarged to be illustrated.

FIG. 8 is a plan view illustrating a schematic configuration in which a part of a surface of a semiconductor chip being a component of a semiconductor device according to a modification example 1 of the first embodiment is enlarged to be illustrated.

In a semiconductor chip 30 of the present example, the first row 2 and the second row 3 are formed as same as the semiconductor chip 1 in the first embodiment.

In the semiconductor chip 30, a bonding portion 14a to which the bonding wire is connected and an inspection target portion 14b with which the probe needles are brought into contact at the electrical inspection time of the semiconductor chip 30 are defined at different positions on each surface of the first external connection terminal 14 in addition to the constitution of the first row 2 and the second row 3 in the semiconductor chip 1. Similarly, a bonding portion 15a to which the bonding wire is connected and an inspection target portion 15b with which the probe needles are brought into contact at the electrical inspection time of the semiconductor chip 30 are defined at different positions on each surface of the second external connection terminal 15.

Here, the bonding portion 14a is provided at a position near the connection portion of the first external connection terminal 14 with the first I/O cell 12, and the inspection target portion 14b is provided at a position far from the connection portion of the first external connection terminal 14 with the first I/O cell 12 on each surface of the first external connection terminal 14. Similarly, the bonding portion 15a is provided at a position near the connection portion of the second external connection terminal 15 with the second I/O cell 13, and the inspection target portion 15b is provided at a position far from the connection portion of the second external connection terminal 15 with the second I/O cell 13 on each surface of the second external connection terminal 15.

Namely, the bonding portion 14a is provided at outside (at a position near the scribe line SL), and the inspection target portion 14b is provided at inside (at a position far from the scribe line SL) at the first row 2. On the other hand, the bonding portion 15a is provided at inside (at a position far from the scribe line SL), and the inspection target portion 15b is provided at outside (at a position near the scribe line SL) at the second row 3.

Generally, there is a case when problems such as lowering of current density and lowering of adhesive strength of the bonding wire occur because the surface of the external connection terminal is scratched resulting that the probe needles are brought into contact with the external connection terminal at the electrical inspection time and the wire bonding is performed under this state, when the bonding portion and the inspection target portion are not distinguished (not cared) on the external connection terminal. The lowering of current density becomes particularly remarkable when the connection portion of the external connection terminal with the I/O cell is scratched by the probe needles.

In the present example, negative effect resulting from the contact of the probe needles at the electrical inspection time is avoided, enough current density is secured, and improvement in the adhesive strength between the first external connection terminal 14, the second external connection terminal 15 and the bonding wires are enabled by constituting the first external connection terminal 14 and the second external connection terminal 15 as stated above.

As it is described hereinabove, according to the present example, it is possible to provide the semiconductor device with high reliability capable of preventing the disadvantages such as the characteristic deterioration of the semiconductor integrated circuit and the accuracy deterioration of the electrical inspection, and the disadvantage resulting from the probe needle contact for the electrical inspection, while fully securing the electrical connection of the probe needles with the first external connection terminal 14 and the second external connection terminal 15 at the electrical inspection time, and enabling higher integration, higher function of the semiconductor chip 30 by shortening the distance between the adjacent first external connection terminal 14 and second external connection terminal 15 at the first row 2 and the second row 3 as much as possible, in the semiconductor device having the constitution in which the I/O cells disposing the external connection terminals are arranged in parallel in two rows.

Modification Example 2

Figure 9:
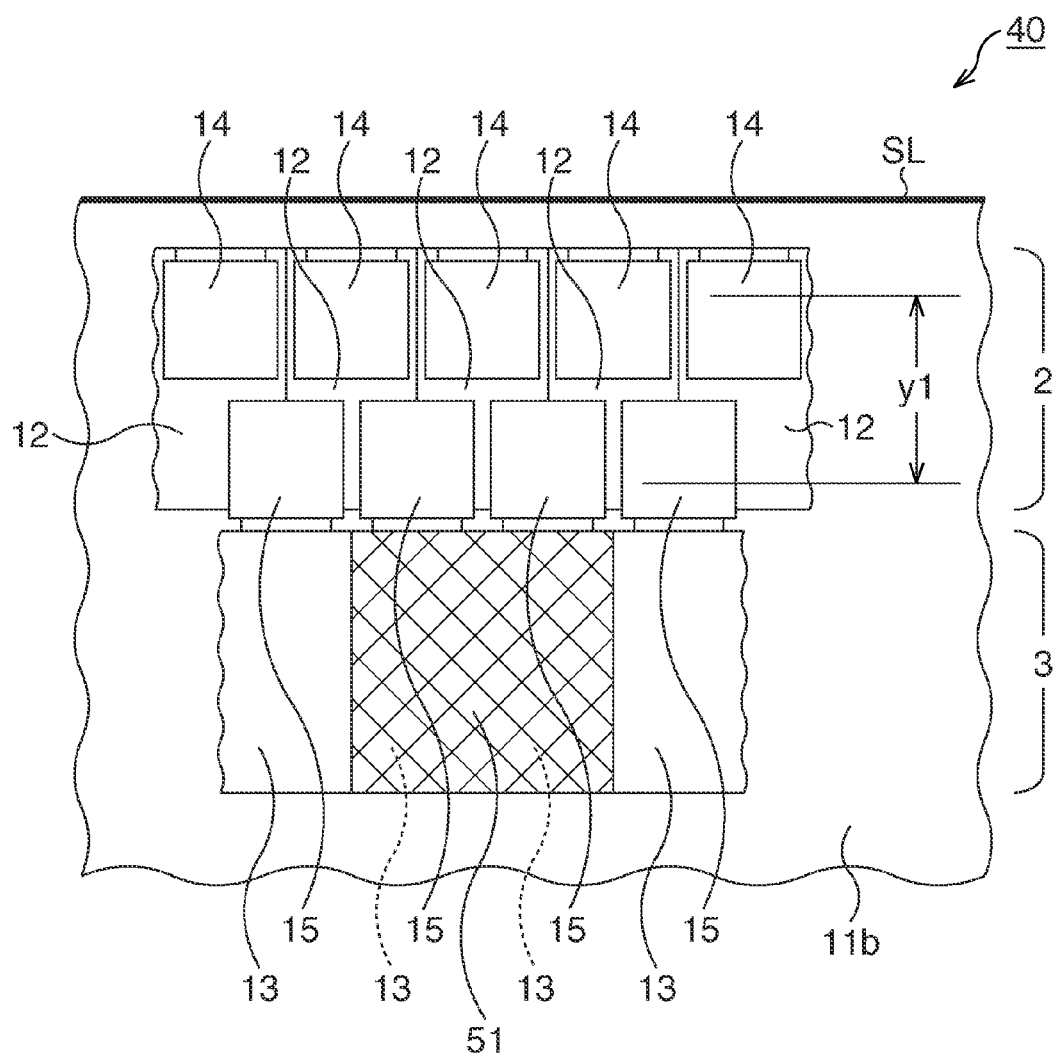
FIG. 9 is a plan view illustrating a schematic configuration in which a part of a surface of a semiconductor chip being a component of a semiconductor device according to a modification example 2 of the first embodiment is enlarged to be illustrated.

FIG. 9 is a plan view illustrating a schematic configuration in which a part of a surface of a semiconductor chip being a component of a semiconductor device according to a modification example 2 of the first embodiment is enlarged to be illustrated.

In a semiconductor chip 40 of the present example, the first row 2 and the second row 3 are formed as same as the semiconductor chip 1 in the first embodiment.

In the semiconductor chip 40, a function macro 51 is embedded at the region of the second I/O cell 13 at the second row 3 (at the regions of the two adjacent second I/O cells 13 in the illustrated example) in addition to the constitution of the first row 2 and the second row 3 in the semiconductor chip 1.

The function macro 51 is constituted by integrating circuits and elements of which element characteristics are easy to be affected by an applied pressure at the connection time of the bonding wire and at the contact time of the probe needles at the electrical inspection time, for example, an A/D converter, a D/A converter, a PLL circuit, and so on.

Figure 10:
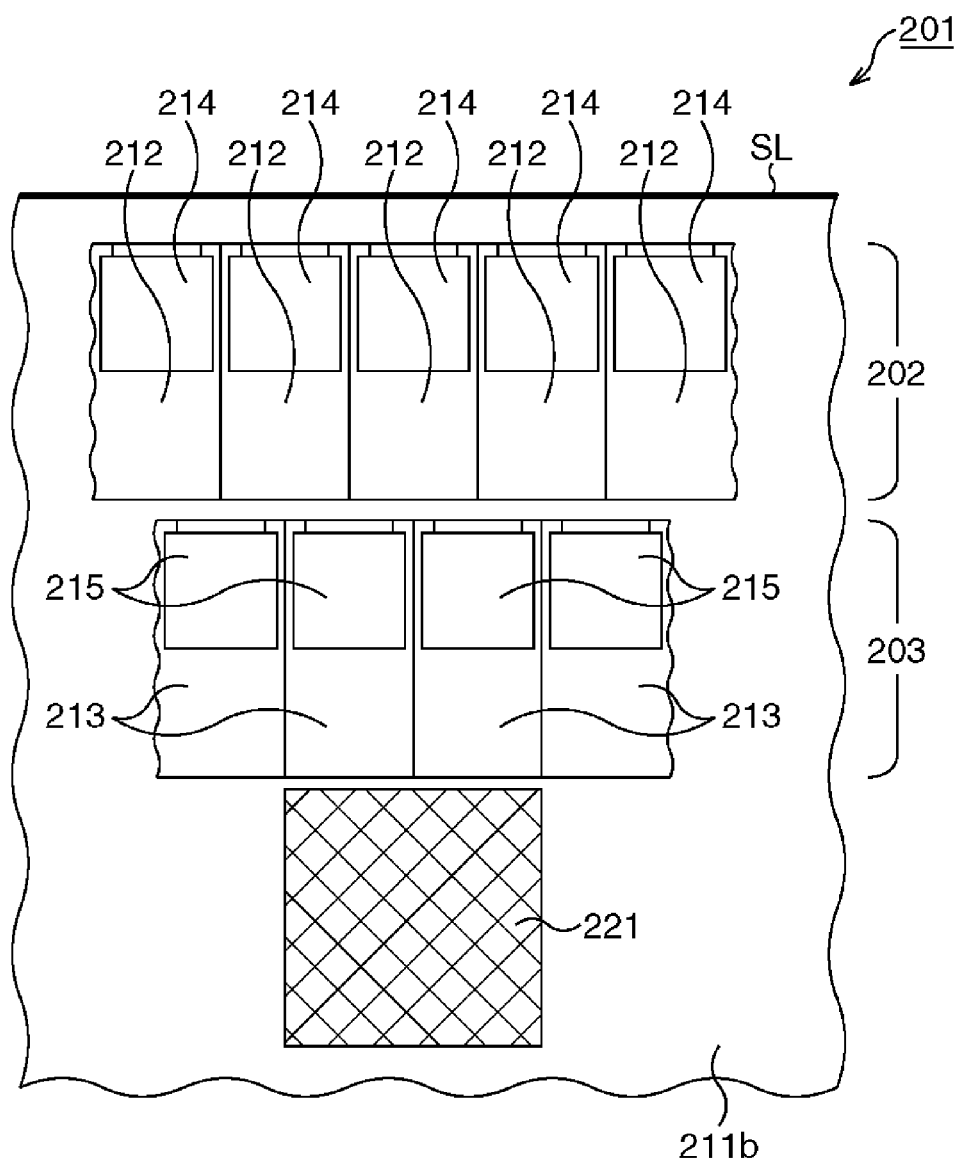
FIG. 10 is a plan view illustrating an appearance in which a function macro is provided at the semiconductor chip of the comparative example 2.

As a reference object of the present example, an appearance in which a function macro 221 is provided at the semiconductor chip 201 of the comparative example 2 is illustrated in FIG. 10.

The second external connection terminal 215 is provided on the second I/O cell 213 at the second row 203 of the semiconductor chip 201. Accordingly, the function macro 221 including the circuits and elements of which element characteristics are easy to be affected by the applied pressure at the connection time of the bonding wire and at the contact time of the probe needles at the electrical inspection time cannot be provided on the second I/O cell 213. It is therefore necessary to provide the function macro 221 at a position, for example, apart from the second I/O cell 213 as illustrated in the drawing, and an exclusive region for the function macro 221 is required at the surface of the semiconductor chip 201.

On the other hand, in the semiconductor chip 40 of the present example, it is possible to provide the function macro 51 so as to commonly use the occupied region with the second I/O cell 13. Accordingly, an exclusive region for the function macro 51 is not necessary, flexibility in layout improves, and requirement for higher integration, higher function of the semiconductor integrated circuit can be corresponded.

As stated above, according to the present example, it is possible to provide the semiconductor device with high reliability capable of securing flexibility of layout and preventing the disadvantages such as the characteristic deterioration of the semiconductor integrated circuit and the accuracy deterioration of the electrical inspection while fully securing the electrical connection of the probe needles with the first external connection terminal 14 and the second external connection terminal 15 at the electrical inspection time and enabling the higher integration, higher function of the semiconductor chip 40 by shortening the distance between the adjacent first external connection terminal 14 and the second external connection terminal 15 at the first row 2 and the second row 3 as much as possible, in the semiconductor device having the constitution in which the I/O cells disposing the external connection terminals are arranged in parallel in two rows.

Modification Example 3

Figure 11:
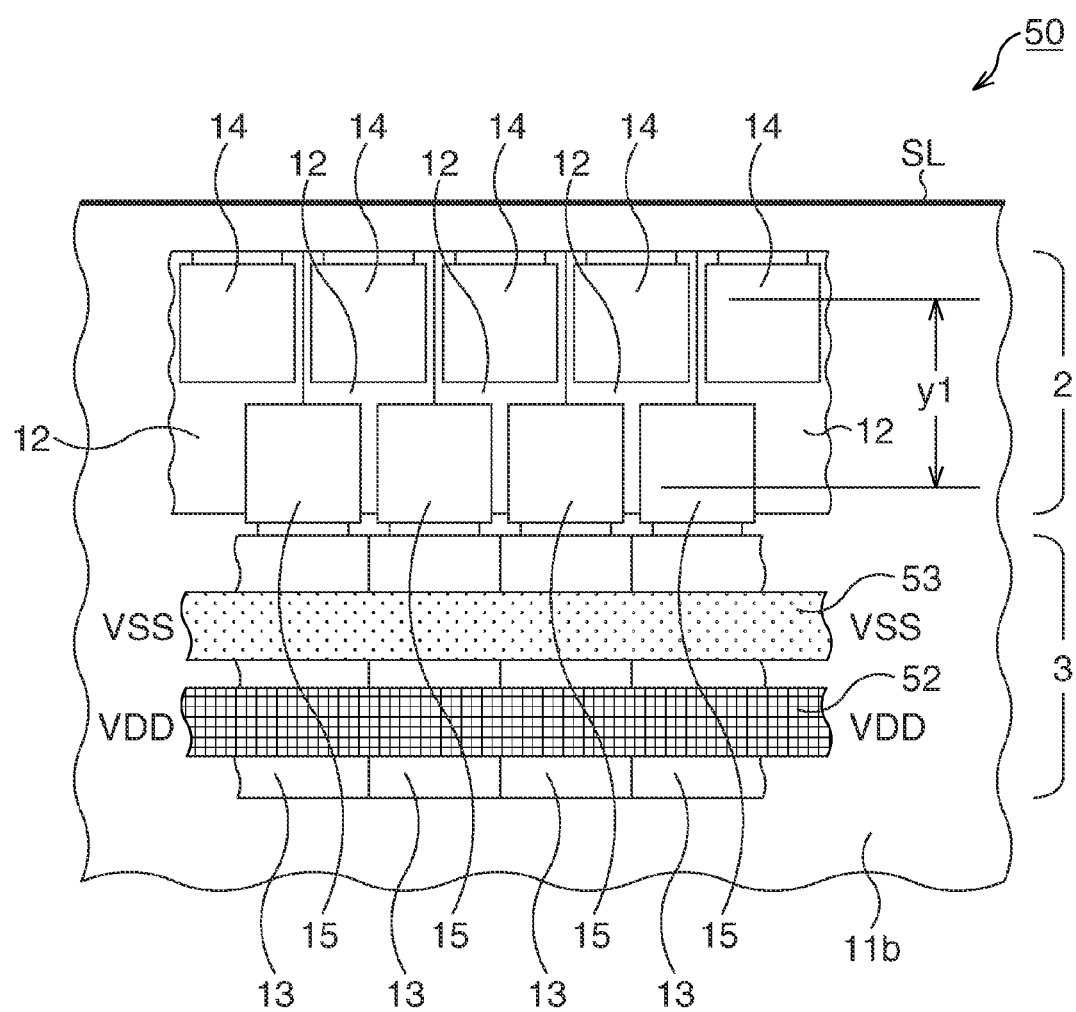
FIG. 11 is a plan view illustrating a schematic configuration in which a part of a surface of a semiconductor chip being a component of a semiconductor device according to a modification example 3 of the first embodiment is enlarged to be illustrated.

FIG. 11 is a plan view illustrating a schematic configuration in which a part of a surface of a semiconductor chip being a component of a semiconductor device according to a modification example 3 of the first embodiment is enlarged to be illustrated.

In a semiconductor chip 50 of the present example, the first row 2 and the second row 3 are formed as same as the semiconductor chip 1 in the first embodiment.

In the semiconductor chip 50, at least one of a power line 52 and a ground line 53 (both in the illustrated example) constituting an I/O ring is disposed at upside of the region of the second I/O cells 13 at the second row 3 in addition to the constitution of the first row 2 and the second row 3 in the semiconductor chip 1.

The power line 52 is to supply power ($V_{DD}$) and the ground line 53 is to give a ground potential ($V_{SS}$) to various semiconductor integrated circuits and so on constituting the circuit forming region 11.

Usually, a power line and a ground line are considered to be provided at a position, for example, inside of the second I/O cells and apart from the second I/O cells in case of the semiconductor chip in which the first row 2 and the second row 3 are disposed.

In the semiconductor chip 50 of the present example, the power line 52 and the ground line 53 are provided by using the regions of the adjacent second I/O cells 13 within the second row 3 so as to commonly use the occupied region with the second I/O cell 13. Accordingly, an exclusive region for the power line 52 and the ground line 53 is not necessary, flexibility in layout improves, and requirement for higher integration, higher function of the semiconductor integrated circuit can be corresponded.

As stated above, according to the present example, it is possible to provide the semiconductor device with high reliability capable of securing flexibility in layout and preventing the disadvantages such as the characteristic deterioration of the semiconductor integrated circuit and the accuracy deterioration of the electrical inspection while fully securing the electrical connection of the probe needles with the first external connection terminal 14 and the second external connection terminal 15 at the electrical inspection time and enabling the higher integration, higher function of the semiconductor chip 50 by shortening the distance between the adjacent first external connection terminal 14 and the second external connection terminal 15 at the first row 2 and the second row 3 as much as possible, in the semiconductor device having the constitution in which the I/O cells disposing the external connection terminals are arranged in parallel in two rows.

Modification Example 4

Figure 12:
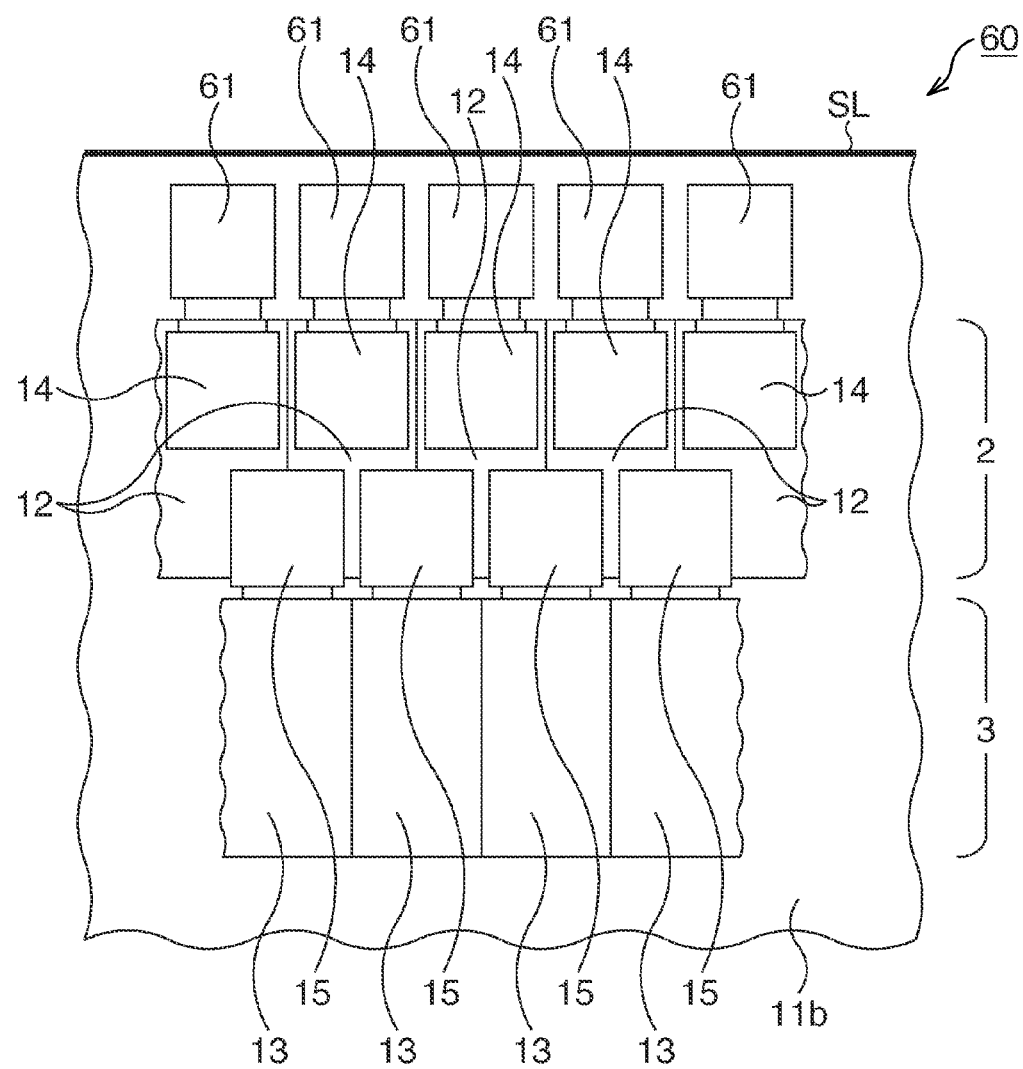
FIG. 12 is a plan view illustrating a schematic configuration in which a part of a surface of a semiconductor chip being a component of a semiconductor device according to a modification example 4 of the first embodiment is enlarged to be illustrated.

FIG. 12 is a plan view illustrating a schematic configuration in which a part of a surface of a semiconductor chip being a component of a semiconductor device according to a modification example 4 of the first embodiment is enlarged to be illustrated.

In a semiconductor chip 60 of the present example, the first row 2 and the second row 3 are formed as same as the semiconductor chip 1 in the first embodiment.

In the semiconductor chip 60, pads for test 61 dedicated for the electrical test are formed by being connected to the first external connection terminals 14 so as to protrude toward outside of the first row (a position near the scribe line SL than the first row 2) in addition to the constitution of the first row 2 and the second row 3 in the semiconductor chip 1.

In this case, the first external connection terminal 14 and the second external connection terminal 15 are exclusively used as the bonding pads to which the bonding wires are connected. On the other hand, the pad for test 61 is used for the electrical test, and the probe needles are brought into contact with the pad for test 61. Accordingly, in the semiconductor chip 60, the electrical test is not performed for the second row 3.

Generally, when the external connection terminal is commonly used for the bonding portion and the inspection target portion, negative effect on the integrated circuits and so on under the external connection terminal is worried resulting from the contact of the probe needles at the electrical inspection time. Besides, at this time, there is a case when problems occur such as the lowering of the current density and the lowering of the adhesive strength of the bonding wire because the surface of the external connection terminal is scratched caused by the contact of the probe needles, and the wire bonding is performed under this state.

In the present example, the bonding portion and the inspection target portion are discriminated, and one is set as the first external connection terminal 14 and the other is set as the pad for test 61. As a result, the negative effect resulting from the contact of the probe needles at the electrical inspection time is avoided, and fully securing of the current density and the improvement of the adhesive strength between the first external connection terminal 14, the second external connection terminal 15 and the bonding wires are enabled.

As stated above, according to the present example, it is possible to provide the semiconductor device with high reliability capable of preventing the disadvantages such as the characteristic deterioration of the semiconductor integrated circuit and the accuracy deterioration of the electrical inspection and the disadvantage resulting from the contact of the probe needles of the electrical inspection while fully securing the electrical connection of the probe needles with the first external connection terminal 14 and the second external connection terminal 15 at the electrical inspection time and enabling the higher integration, higher function of the semiconductor chip 60 by shortening the distance between the adjacent first external connection terminal 14 and the second external connection terminal 15 at the first row 2 and the second row 3 as much as possible, in the semiconductor device having the constitution in which the I/O cells disposing the external connection terminals are arranged in parallel in two rows.

Hereinabove, the modification examples 1 to 4 of the first embodiment are described, but the modification examples are not limited to the above. For example, the modification examples 1 to 4 can be appropriately combined.

Figure 13A:
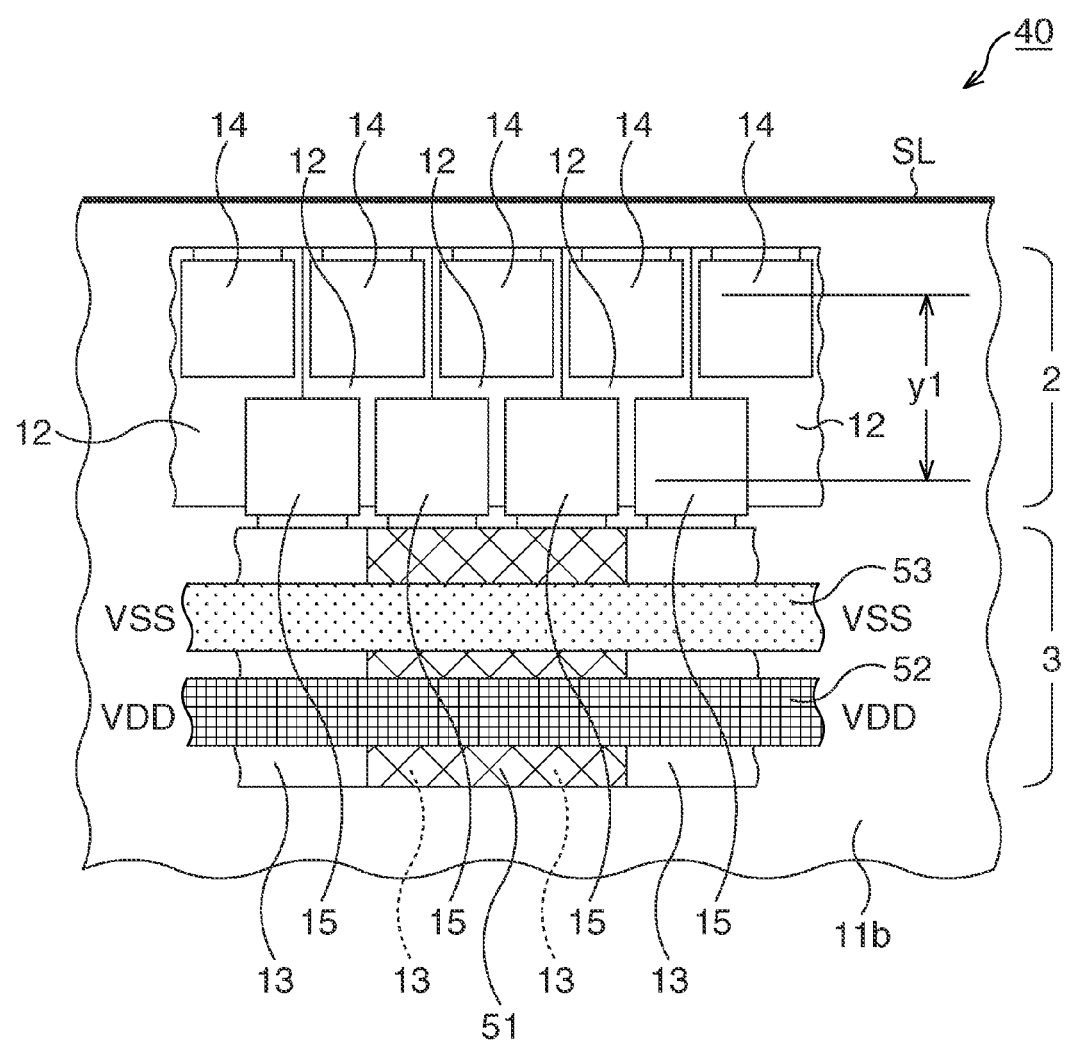
FIG. 13A is a plan view illustrating an appearance in which the modification example 2 is combined with the modification example 3 of the first embodiment.
Figure 13B:
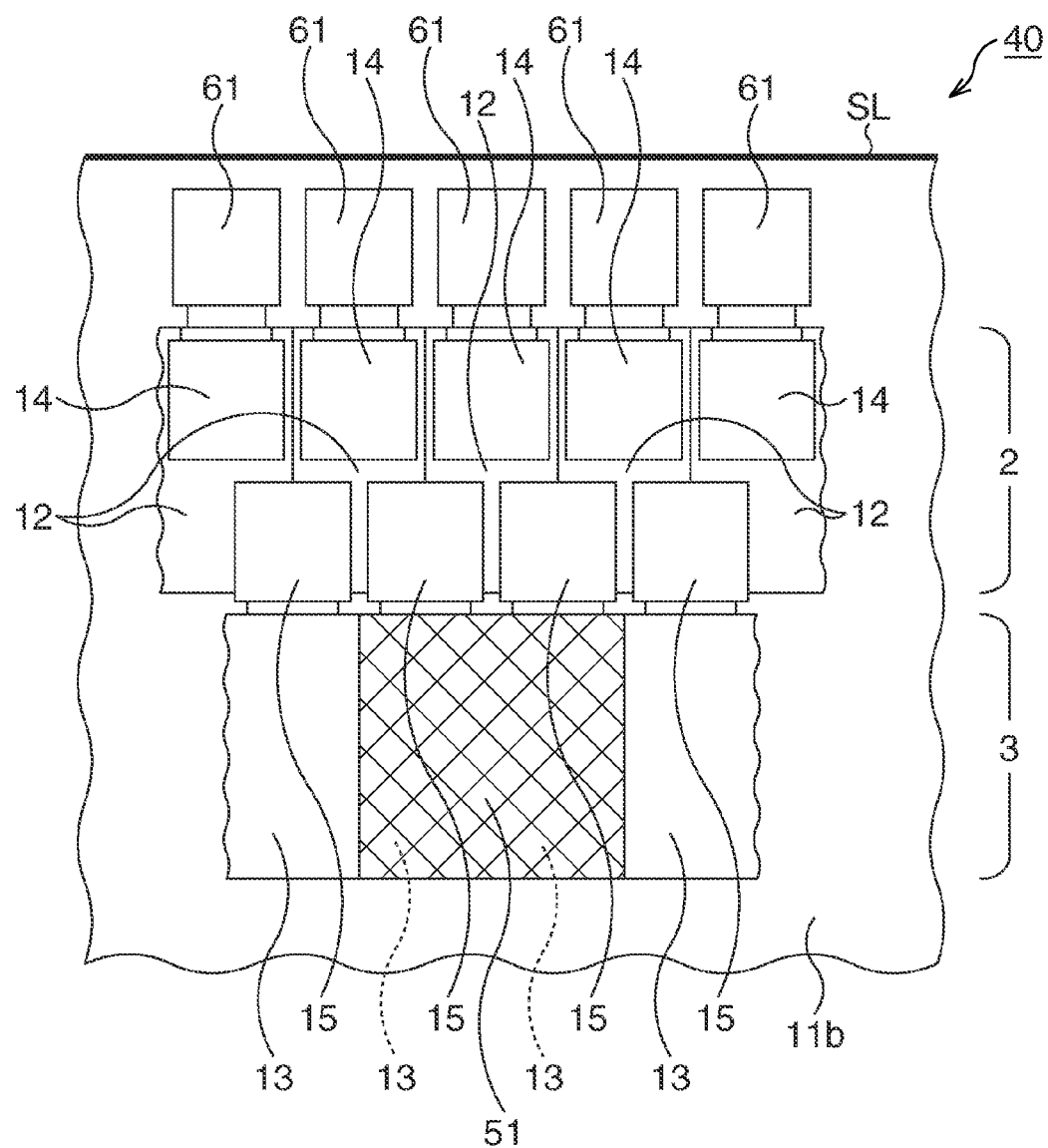
FIG. 13B is a plan view illustrating an appearance in which the modification example 2 is combined with the modification example 4 of the first embodiment.

Specifically, various combinations are possible such as a constitution in which the power line 52 and the ground line 53 are disposed at upside of the region of the second I/O cells 13 including upside of the function macro 51 in the semiconductor chip 40 by combining the modification example 2 and the modification example 3 as in FIG. 13A, a constitution in which the function macro 51 is embedded at the regions of the second I/O cells 13 of the second row 3 and the dedicated pads for test 61 are disposed in the semiconductor chip 40 by combining the modification example 2 and the modification example 4 as in FIG. 13B.

Second Embodiment

Hereinafter, a second embodiment is described. A semiconductor device in the present embodiment is manufactured by the same manufacturing method with the same constitution as the semiconductor device according to the first embodiment, but it is different from the first embodiment in a point that an arrangement of the first row and the second row is different.

Incidentally, the same reference numerals and symbols are used to designate the same and corresponding composing members and so on as the first embodiment, and the detailed description thereof will not be given in the present embodiment.

Figure 14:
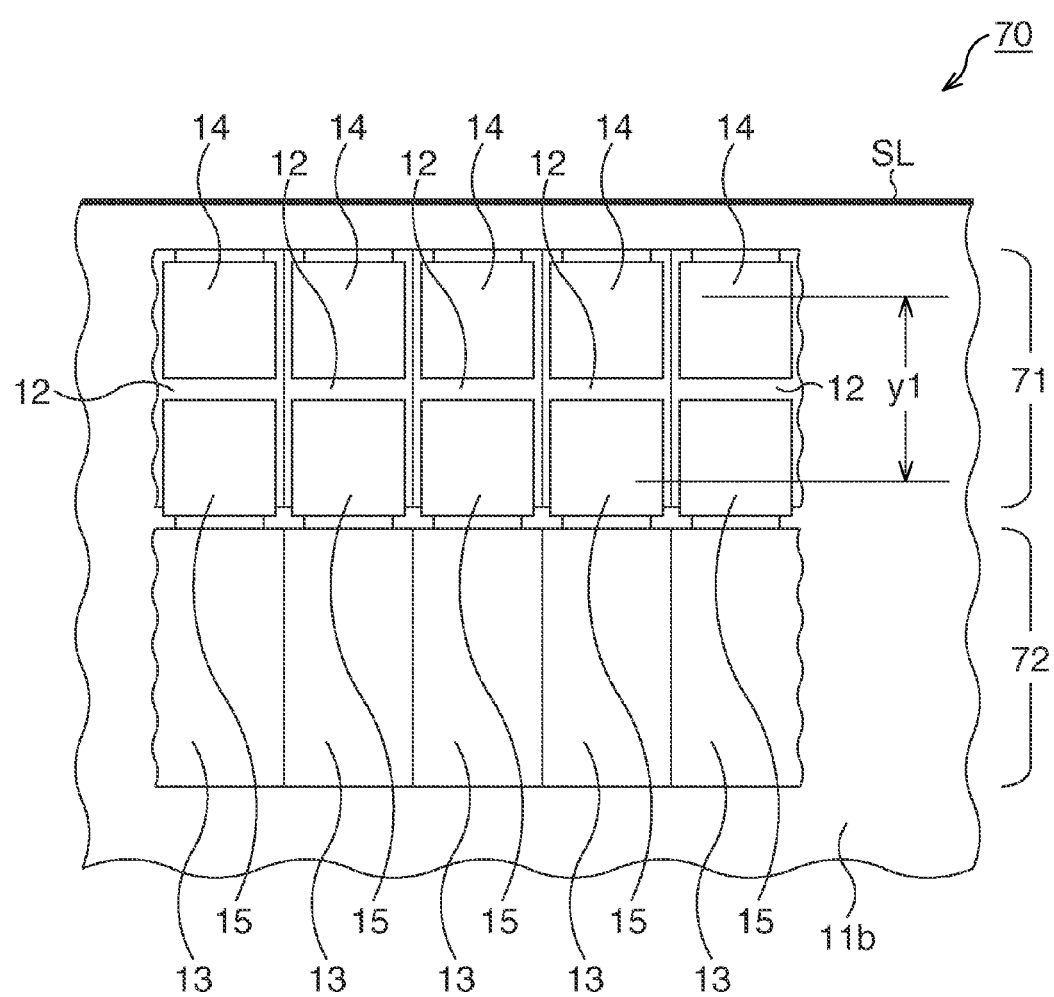
FIG. 14 is a plan view illustrating a schematic configuration in which a part of a surface of a semiconductor chip being a component of a semiconductor device according to a second embodiment is enlarged to be illustrated.

FIG. 14 is a plan view illustrating a schematic configuration in which a part of a surface of a semiconductor chip being a component of the semiconductor device according to the second embodiment is enlarged to be illustrated.

In a semiconductor chip 70, a first row 71 in which the plural first I/O cells 12 and first external connection terminals 14 are arranged in parallel at the outer periphery of the input/output circuit region 11b (at a position near the scribe line SL) and a second row 72 in which the plural second I/O cells 13 and second external connection terminals 15 are arranged in parallel at inside of the first row 71 (at a position near the internal circuit forming region 11a) are disposed at the input/output circuit region 11b as same as the semiconductor chip 1 in the first embodiment.

In the present embodiment, the first external connection terminal 14 is disposed such that at least a part thereof (all in the illustrated example) positions at upside of the first I/O cell 12, and the second external connection terminal 15 is disposed such that at least a part thereof (a portion except a lower end portion in the illustrated example) positions at upside of the first I/O cell 12. Specifically, the first external connection terminal 14 and the second external connection terminal 15 are formed at upside of the corresponding first I/O cell 12 while being arranged in parallel to face with each other. Here, the first external connection terminal 14 and the second external connection terminal 15 are separated for a predetermined distance so as not to have an overlapped portion with each other, and formed in an identical layer.

In this case, the first external connection terminal 14 and the second external connection terminal 15 are disposed in proximity as much as possible at the first row 71 and the second row 72. The separation distance between both, here, the separation distance from a planned connection portion of the bonding wire of the first external connection terminal 14 to a planned connection portion of the bonding wire of the second external connection terminal 15 becomes "y1" as illustrated in the drawing, as same as the semiconductor chip 1 in the first embodiment.

As stated above, according to the present embodiment, it is possible to provide the semiconductor device with high reliability capable of preventing the disadvantages such as the characteristic deterioration of the semiconductor integrated circuit and the accuracy deterioration of the electrical inspection while fully securing the electrical connection of the probe needles with the first external connection terminal 14 and the second external connection terminal 15 at the electrical inspection time and enabling the higher integration, higher function of the semiconductor chip 70 by shortening the distance between the adjacent first external connection terminal 14 and the second external connection terminal 15 at the first row 71 and the second row 72 as much as possible, in the semiconductor device having the constitution in which the I/O cells disposing the external connection terminals are arranged in parallel in two rows.

Hereinabove, the first and the second embodiment are described, but the embodiments are not limited to the above. For example, the modification examples 1 to 4 of the first embodiment can be applied to the second embodiment, and the modification examples 1 to 4 can be appropriately combined to be applied.

According to the present invention, it is possible to provide a semiconductor device with high reliability capable of preventing disadvantages such as characteristic deterioration of a semiconductor integrated circuit and accuracy deterioration of an electrical inspection while fully securing an electrical connection of probe needles with external connection terminals at the electrical inspection time, and enabling higher integration, higher function of the semiconductor device by shortening a distance between adjacent external connection terminals at a first row and a second row as much as possible, in the semiconductor device having a constitution in which I/O cells disposing the external connection terminals are arranged in parallel in two rows.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention has(have) been described in detail, it should be understood that the various changes, substitutions, and alterations could be made hereto without departing from the spirit and scope of the invention.

What is claimed is:
1. A semiconductor device, comprising:
a semiconductor substrate;
a first row in which a plurality of first I/O cells and a plurality of first external connection terminals are disposed in parallel along an outer periphery of the semiconductor substrate at upside of the semiconductor substrate; and
a second row in which a plurality of second I/O cells and a plurality of second external connection terminals are disposed in parallel at inside of the first row along the outer periphery of the semiconductor substrate at upside of the semiconductor substrate,
wherein the first row and the second row are arranged in parallel in this order in a direction away from the outer periphery of the semiconductor substrate,
wherein each of the second external connection terminals is disposed such that at least a part thereof positions at upside of at least one of the first I/O cells.

2. The semiconductor device according to claim 1, wherein the first external connection terminal and the second external connection terminal are formed in an identical layer.

3. The semiconductor device according to claim 1, wherein the first external connection terminal is disposed at upside of the first I/O cell at the first row.

4. The semiconductor device according to claim 1, wherein the second external connection terminal is formed at upside of a boundary portion between the two adjacent first I/O cells.

5. The semiconductor device according to claim 1, wherein each of the first external connection terminals and each of the second external connection terminals are formed to be arranged in parallel to face with each other.

6. The semiconductor device according to claim 1, wherein each of the first external connection terminals and each of the second external connection terminals each have a bonding portion to connect with a connection portion outside of the semiconductor device and an inspection target portion for electrical inspection at different positions, the bonding portion at the first row is disposed at outside, and the bonding portion at the second row is disposed at inside.

7. The semiconductor device according to claim 1, wherein a function macro is disposed to be sandwiched between the second I/O cells.

8. The semiconductor device according to claim 1, wherein a power wiring or a ground wiring is disposed at upside of the second I/O cells.

9. The semiconductor device according to claim 1, wherein each of the first external connection terminals and each of the second external connection terminals each function as a terminal for a bonding terminal, and
wherein pads for test are disposed at outside of the first row, the pads for test being connected to the first external connection terminals.

10. A manufacturing method of a semiconductor device, comprising:
forming a first row constituted by a plurality of first I/O cells and a plurality of first external connection terminals in parallel along an outer periphery of a semiconductor substrate, and a second row constituted by a plurality of second I/O cells and a plurality of second external connection terminals in parallel at inside of the first row along the outer periphery of the semiconductor substrate, at upside of a semiconductor substrate, so that the first row and the second row are arranged in parallel in order in a direction away from the outer periphery of the semiconductor substrate, wherein each of the second external connection terminals is disposed such that at least a part thereof positions at upside of at least one of the first I/O cells.

11. The manufacturing method of the semiconductor device according to claim 10,
wherein the first external connection terminal and the second external connection terminal are formed in an identical layer.

12. The manufacturing method of the semiconductor device according to claim 10,
wherein the first external connection terminal is disposed at upside of the first I/O cell at the first row.

13. The manufacturing method of the semiconductor device according to claim 10,
wherein the second external connection terminal is formed at upside of a boundary portion between the two adjacent first I/O cells.

14. The manufacturing method of the semiconductor device according to claim 10,
wherein each of the first external connection terminals and each of the second external connection terminals are formed in parallel to face with each other.

15. The manufacturing method of the semiconductor device according to claim 10, further comprising:
electrically connecting the first external connection terminals and the second external connection terminals with external terminals alternately from outside of the semiconductor substrate after the forming the first row and the second row.

16. The manufacturing method of the semiconductor device according to claim 10,
wherein each of the first external connection terminals and each of the second external connection terminals each have a bonding portion connecting with the external terminals and an inspection target portion for electrical inspection at different positions, and the bonding portion of each of the first external connection terminals is disposed at a position near from the outer periphery of the semiconductor substrate than the inspection target portions of each of the first external connection terminals, and the bonding portion of each of the second external connection terminals is disposed at a position far from the outer periphery of the semiconductor substrate than the inspection target portions of each of the second external connection terminals.

17. The manufacturing method of the semiconductor device according to claim 10,
wherein a function macro is disposed to be sandwiched between the second I/O cells.

18. The manufacturing method of the semiconductor device according to claim 10,
wherein a power wiring or a ground wiring is disposed at upside of the second I/O cells.

19. The manufacturing method of the semiconductor device according to claim 10,
wherein each of the first external connection terminals and each of the second external connection terminals each function as a terminal for a bonding terminal, and
wherein pads for test are disposed at outside of the first row to be connected to the first external connection terminals.

20. A semiconductor device comprising:
a first disposition including a plurality of first I/O cells disposed in a first direction;
a second disposition including a plurality of second I/O cells disposed in the first direction; and
an external terminal coupled to any one of the plurality of second I/O cells, at least a part of the external terminal overlapping any one of the plurality of first I/O cells,
wherein a first distance, in a second direction being perpendicular to the first direction, from a periphery of the semiconductor device to the first disposition is shorter than a second distance, in the second direction, from the periphery to the second disposition.

* * * * *